United States Patent
Terauchi et al.

(10) Patent No.: US 9,525,404 B2
(45) Date of Patent: Dec. 20, 2016

(54) INPUT CIRCUIT

(71) Applicant: Kabushiki Kaisha Toshiba, Minato-ku, Tokyo (JP)

(72) Inventors: Ryota Terauchi, Yokohama Kanagawa (JP); Shinsuke Fujii, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 14/476,217

(22) Filed: Sep. 3, 2014

(65) Prior Publication Data
US 2015/0214935 A1    Jul. 30, 2015

(30) Foreign Application Priority Data
Jan. 27, 2014 (JP) .................................. 2014-012689

(51) Int. Cl.
| | |
|---|---|
| *H03K 5/00* | (2006.01) |
| *H03K 5/003* | (2006.01) |
| *H03K 19/0175* | (2006.01) |
| *H03K 5/08* | (2006.01) |

(52) U.S. Cl.
CPC ............ *H03K 5/003* (2013.01); *H03K 5/086* (2013.01); *H03K 19/017527* (2013.01); *H03K 19/017545* (2013.01); *H03K 19/017563* (2013.01)

(58) Field of Classification Search
None
See application file for complete search history.

(56) References Cited

U.S. PATENT DOCUMENTS

| | | | | |
|---|---|---|---|---|
| 5,844,431 A | * | 12/1998 | Chen | G11C 27/026 327/94 |
| 6,078,613 A | * | 6/2000 | Bingel | H04L 25/0274 375/220 |
| 6,373,856 B1 | | 4/2002 | Higashida | |
| 7,417,462 B1 | * | 8/2008 | Wong | H03K 19/17744 326/37 |
| 7,649,409 B1 | * | 1/2010 | Koh | H03F 3/45085 326/30 |
| 8,866,529 B2 | * | 10/2014 | Wu | G05F 3/08 327/320 |
| 2005/0218976 A1 | * | 10/2005 | Haraguchi | H03F 3/45977 330/9 |
| 2007/0052482 A1 | * | 3/2007 | Kasha | H03F 3/45183 330/302 |
| 2012/0133459 A1 | * | 5/2012 | Zhuang | H04B 3/14 333/28 R |
| 2014/0256276 A1 | * | 9/2014 | Li | H04B 3/30 455/230 |

FOREIGN PATENT DOCUMENTS

| | | |
|---|---|---|
| JP | 2003-179639 A | 6/2003 |
| JP | 2009-038546 A | 2/2009 |
| JP | 2011-130281 A | 6/2011 |
| JP | 2012-100017 A | 5/2012 |

* cited by examiner

*Primary Examiner* — Tuan T Lam
(74) *Attorney, Agent, or Firm* — White & Case LLP (57) ABSTRACT

The input circuit includes a first switch control circuit that controls a first switch and a second switch. The first switch control circuit turns off the first switch and the second switch in a first period during which a first input signal and a second input signal are DC signals. The first switch control circuit turns on the first switch and the second switch in a second period during which the first input signal and the second input signal are AC signals.

12 Claims, 5 Drawing Sheets

INPUT CIRCUIT

CROSS-REFERENCE TO RELATED APPLICATION

This application is based upon and claims the benefit of priority from the prior Japanese Patent Application No. 2014-012689, filed on Jan. 27, 2014, the entire contents of which are incorporated herein by reference.

BACKGROUND

Field

Embodiments described herein relate generally to an input circuit.

Background Art

In recent years, differential transmission standards such as LVDS (Low voltage differential signaling) and MIPI (Mobile Industry Processor Interface) have become widespread as methods for transmitting a large number of signals with a small number of wires between many digital devices including portable equipment such as a smartphone and a tablet and memory interfaces.

For circuits that receive differential signals, a circuit system is available in which an input terminal has a coupling capacitance, a DC signal of an input signal is cut, and only an AC signal is received.

If a differential signal is received using a coupling capacitance in this circuit system, signals "1" and "0" need to be received in equal proportions.

If the signals "1" and "0" are fixed for a certain period or are received in unequal proportions, leading to uneven charging/discharging in both capacitances. Thus, the signals may not be DC balanced. In order to avoid this problem, transmit data is coded in a transmitting circuit before the data is transmitted. Thus, signals "1" and "0" are transmitted in equal proportions.

Under some standards, however, effective data need to be received in a short time after a high-speed differential signal is started. In only a short time after a high-speed differential signal is received, an EYE aperture is small. This may cause a differential signal receiving circuit to have an insufficient timing margin and thus data may not be normally received.

DETAILED DESCRIPTION

An input circuit according to an embodiment includes a first input terminal that receives a first input signal. The input circuit includes a second input terminal that receives a second input signal that is phase-reversed from the first input signal. The input circuit includes a first capacitor with a first end connected to the first input terminal and a second end connected to a first node. The input circuit includes a second capacitor with a first end connected to the second input terminal and a second end connected to a second node. The input circuit includes a reference voltage generating circuit that generates a reference voltage and supplies the voltage to a reference node. The input circuit includes a first resistor connected between the first node and the reference node. The input circuit includes a second resistor connected between the second node and the reference node. The input circuit includes a first switch connected in series with the first resistor between the first node and the reference node. The input circuit includes a second switch connected in series with the second resistor between the second node and the reference node. The input circuit includes a differential receiving circuit with a first input connected to the first node and a second input connected to the second node, the differential receiving circuit receiving differential signals inputted to the first input and the second input and outputting a single-phase output signal. The input circuit includes a first switch control circuit that controls the first switch and the second switch.

The first switch control circuit turns off the first switch and the second switch in a first period during which the first input signal and the second input signal are DC signals.

The first switch control circuit turns on the first switch and the second switch in a second period during which the first input signal and the second input signal are AC signals.

Embodiments will be described below with reference to the accompanying drawings.

[First Embodiment]

Figure 1:
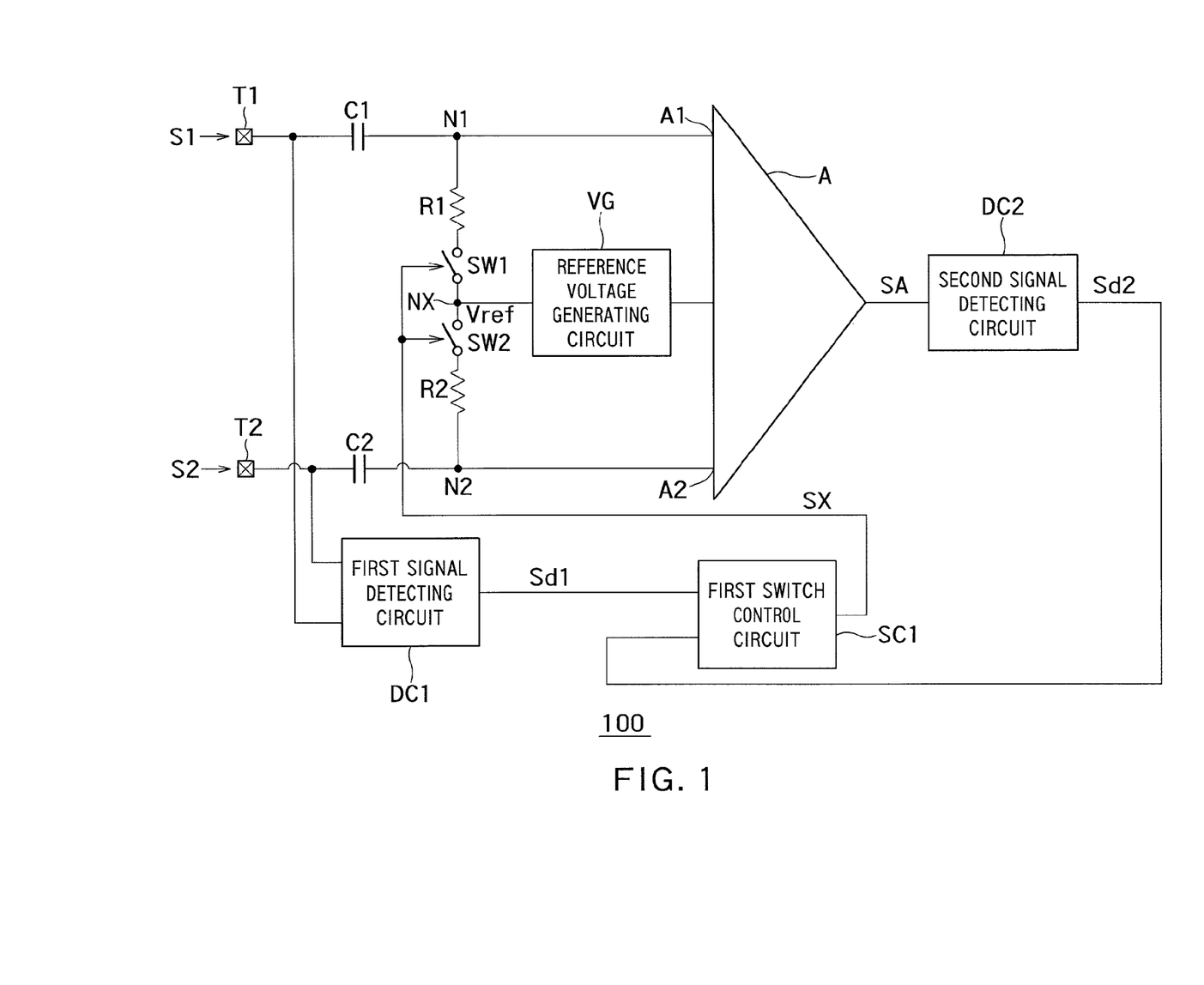
FIG. 1 is a circuit diagram showing an example of the configuration of an input circuit 100 according to a first embodiment.

FIG. 1 is a circuit diagram showing an example of the configuration of an input circuit 100 according to a first embodiment.

As shown in FIG. 1, the input circuit 100 includes a first input terminal T1, a second input terminal T2, a first capacitor C1, a second capacitor C2, a reference voltage generating circuit VG, a first resistor R1, a second resistor R2, a first switch SW1, a second switch SW2, a differential receiving circuit A, a first switch control circuit SC1, a first signal detecting circuit DC1, and a second signal detecting circuit DC2.

The first input terminal T1 receives a first input signal S1.

The second input terminal T2 receives a second input signal S2 that is phase reversed from the first input signal S1. The first input signal S1 and the second input signal S2 constitute a differential signal.

One end of the first capacitor C1 is connected to the first input terminal T1 and the other end of the first capacitor C1 is connected to a first node N1.

One end of the second capacitor C2 is connected to the second input terminal T2 and the other end of the second capacitor C2 is connected to a second node N2.

The reference voltage generating circuit VG generates a reference voltage Vref and supplies the voltage to a reference node NX.

The first resistor R1 is connected between the first node N1 and the reference node NX.

The second resistor R2 is connected between the second node N2 and the reference node NX.

The first switch SW1 is connected in series with the first resistor R1 between the first node N1 and the reference node NX.

The second switch SW2 is connected in series with the second resistor R2 between the second node N2 and the reference node NX.

The differential receiving circuit A includes a first input A1 that is connected to the first node N1 and a second input A2 that is connected to the second node N2. The differential receiving circuit A receives differential signals inputted to the first input A1 and the second input A2 and outputs a single-phase (single-ended) output signal SA. The output signal SA is an output signal of the input circuit 100.

The first signal detecting circuit DC1 receives the first input signal S1 through the first input terminal T1 and receives the second input signal S2 through the second input terminal T2. The first signal detecting circuit DC1 then outputs a detection signal based on the first input signal S1 and the second input signal S2.

For example, if the first signal detecting circuit DC1 detects that the first input signal S1 and the second input signal S2 are DC signals (low speed signals), the first signal detecting circuit DC1 outputs a first detection signal Sd1.

The DC signal contains at least a prespecified number (e.g., six) of consecutive identical bits in a preset specified period (e.g., 100 ns).

The second signal detecting circuit DC2 receives the output signal SA of the differential receiving circuit A and outputs a detection signal based on the output signal SA.

If the second signal detecting circuit DC2 detects that the output signal SA is an AC signal (high speed signal), the second signal detecting circuit DC2 outputs a second detection signal Sd2.

The AC signal contains a smaller number of consecutive identical bits than the specified number in the specified period. The ratio between logic "1" and logic "0" in the AC signal is 1 to 1.

In response to the first detection signal Sd1 and the second detection signal Sd2, the first switch control circuit SC1 controls the first switch SW1 and the second switch SW2 with a first control signal SX The first switch control circuit SC1 turns off the first switch SW1 and the second switch SW2 in response to the first detection signal Sd1.

In other words, the first switch control circuit SC1 turns off the first switch SW1 and the second switch SW2 in a first period during which the first input signal S1 and the second input signal S2 are DC signals.

Moreover, the first switch control circuit SC1 turns on the first switch SW1 and the second switch SW2 in response to the second detection signal Sd2.

Specifically, the first switch control circuit SC1 turns on the first switch SW1 and the second switch SW2 in a second period during which the first input signal S1 and the second input signal S2 are AC signals.

An example of the operating characteristics of the input circuit according to the present embodiment configured thus will be described below.

Figure 2:
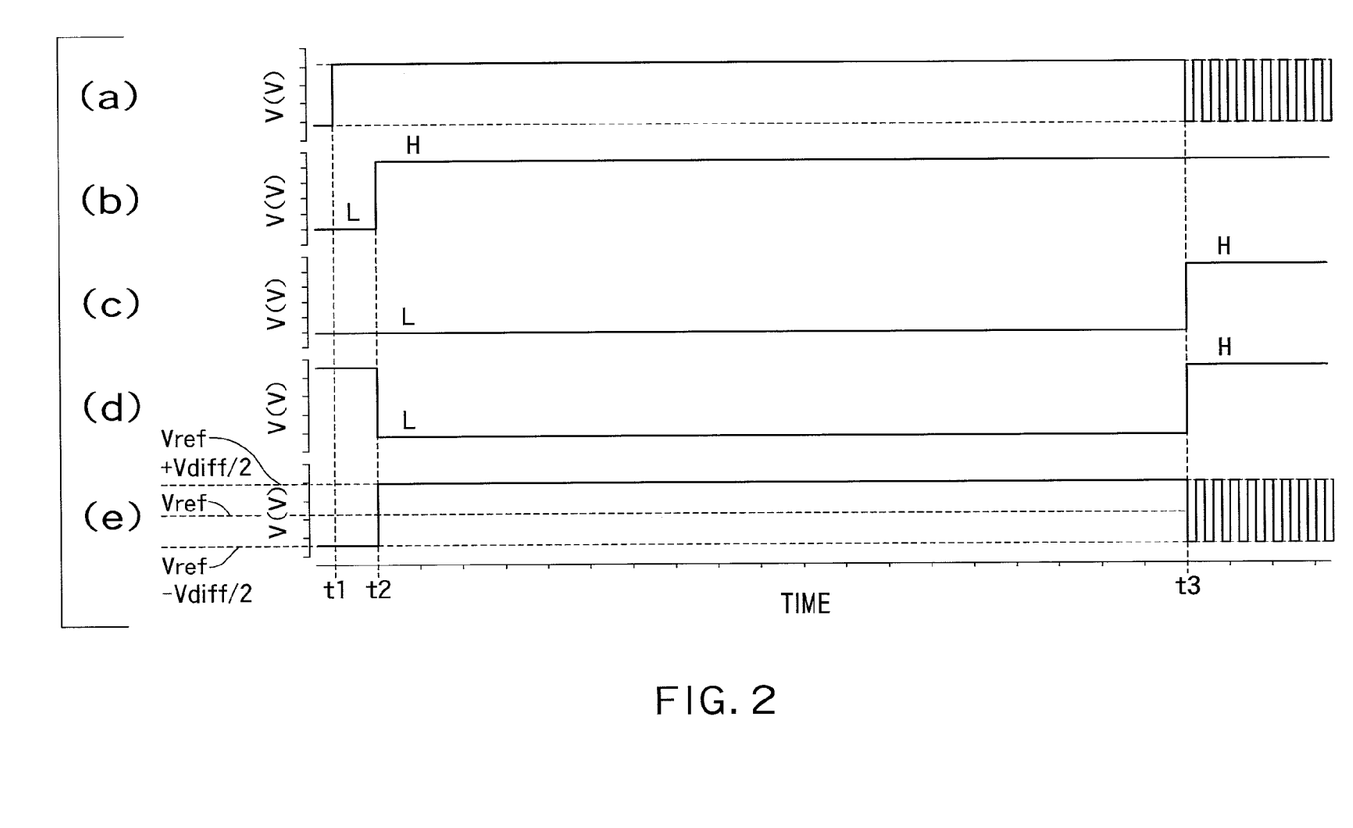
FIG. 2 shows signal waveforms inputted to the input circuit 100 of FIG. 1 and the signal waveforms of the nodes.
Figure 3:
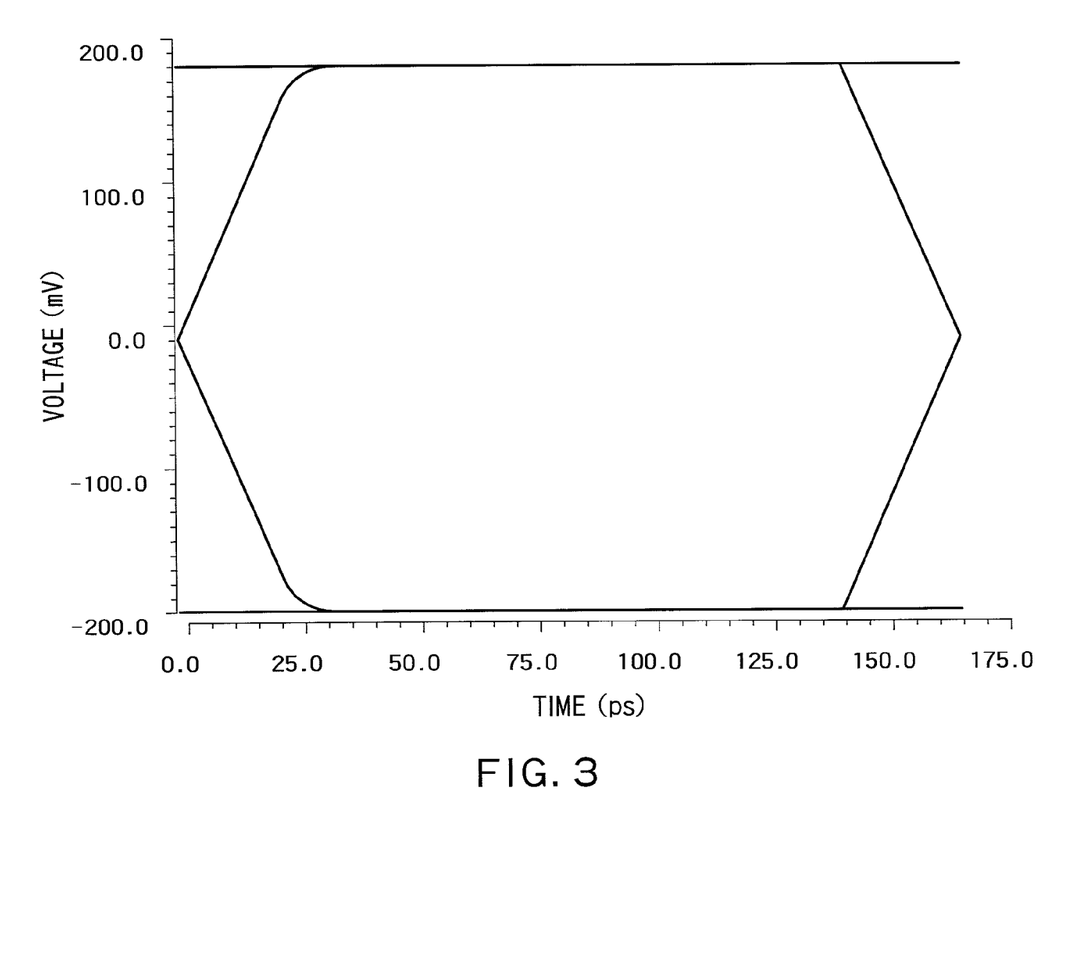
FIG. 3 shows an example of the signal waveforms (EYE waveforms) of the first and second nodes N1 and N2 of the input circuit 100 of FIG. 1.

FIG. 2 shows signal waveforms inputted to the input circuit 100 and the signal waveforms of the nodes. FIG. 3 shows an example of the signal waveforms (EYE waveforms) of the first and second nodes N1 and N2.

In FIG. 2, (a) indicates a differential signal inputted to the first and second input terminals T1 and T2, (b) indicates the waveform of the detection signal of the first signal detecting circuit DC1, (c) indicates the waveform of the detection signal of the second signal detecting circuit DC2, and (d) shows the waveform of the first control signal SX.

As shown in FIG. 2, a fixed signal "1" constituting the DC signal is inputted to the first and second input terminals T1 and T2 at, for example, time t1.

At time t2, the first signal detecting circuit DC1 detects that the first input signal S1 and the second input signal S2 are DC signals (low speed signals), and then outputs the first detection signal Sd1 ("High" level). The first switch control circuit SC1 sets the first control signal SX at "Low" level in response to the first detection signal Sd1, turning off the first switch SW1 and the second switch SW2.

The first switch SW1 and the second switch SW2 are turned off, eliminating a charging/discharging path of the first and second capacitors C1 and C2. This keeps the first node N1 at a potential of Vref+Vdiff/2 and the second node N2 at a potential of Vref−Vdiff/2. A voltage Vdiff corresponds to a potential difference between "High" level and "Low" level of the differential signal.

Actually, the first and second nodes N1 and N2 are charged and discharged because the switches and the differential signal receiving circuit have a leak path on the order of nA. However, the influence of charging and discharging in a short time of 100 ns is negligible.

Subsequently, at time t3, the AC signal (high-speed signal) is inputted to the first and second input terminals T1 and T2. The second signal detecting circuit DC2 detects that the output signal SA is an AC signal, and then outputs the second detection signal Sd2 ("High" level). The first switch control circuit SC1 sets the first control signal SX at "High" level in response to the second detection signal Sd2, turning on the first switch SW1 and the second switch SW2.

This keeps the first node N1 at a potential of Vcm+Vdiff/2 and the second node N2 at a potential of Vcm−Vdiff/2. Vcm denotes the center voltage of the differential signal.

Thus, even immediately after the AC signal (high speed signal) is inputted, the differential signals of the first node N1 and the second node N2 are still DC balanced (FIG. 3).

As described above, in the input circuit 100, the differential signals are still DC balanced even immediately after the reception of the high speed signal. Thus, the input circuit 100 can receive signals without losing a timing margin.

As described above, the input circuit according to the present embodiment can suppress a reduction in timing margin.

[Second Embodiment]

For example, under some standards for the start of communications, an inversion signal of at least 1 us is inputted, a fixed signal of 100 ns is inputted, and then a data signal is inputted.

In the present embodiment, an example of an input circuit compliant with such a standard will be described below.

Figure 4:
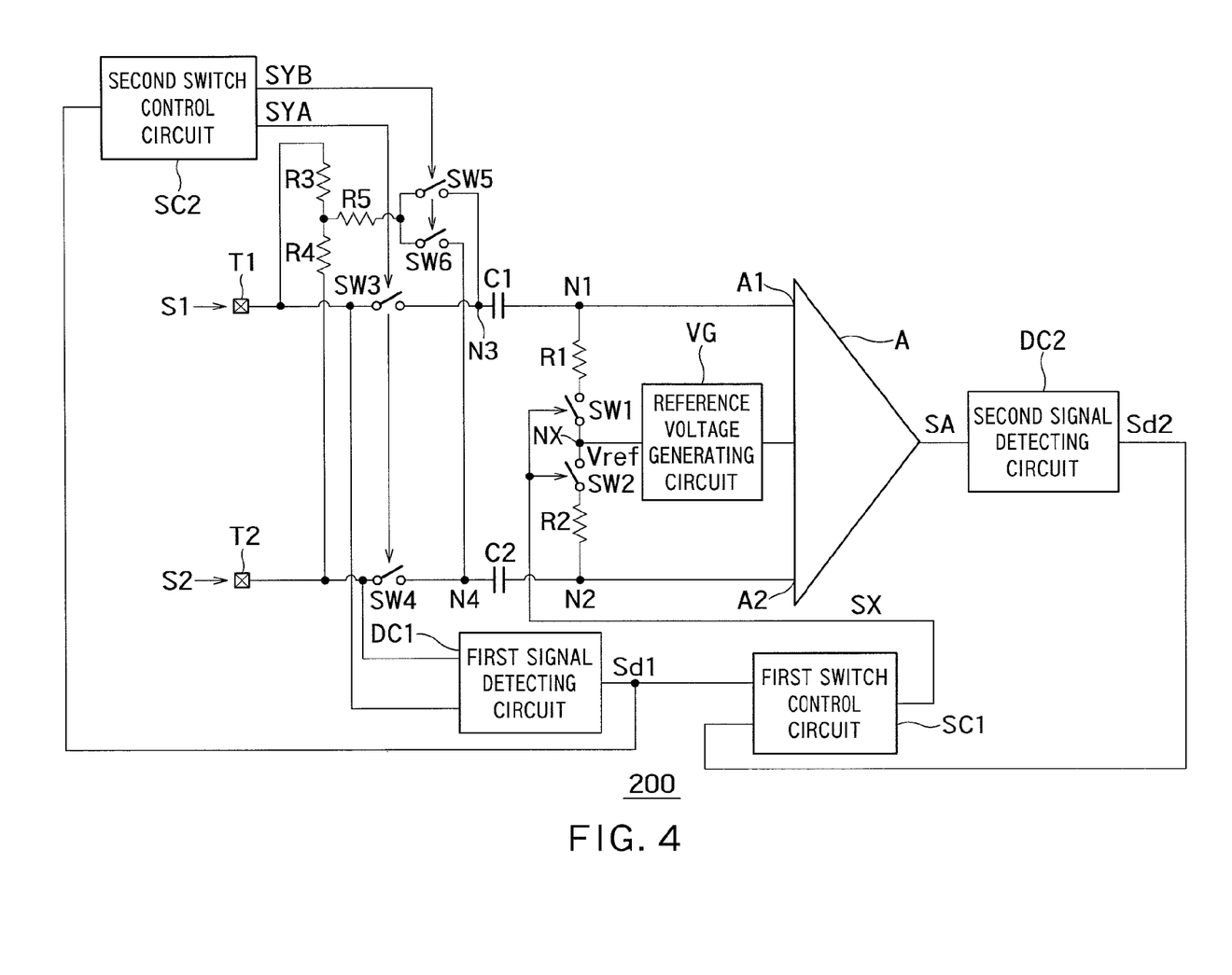
FIG. 4 is a circuit diagram showing an example of the configuration of an input circuit 200 according to a second embodiment.

FIG. 4 is a circuit diagram showing an example of the configuration of an input circuit 200 according to a second embodiment. In FIG. 4, the same reference numerals as those of FIG. 1 denote the same configurations as those of the first embodiment.

As shown in FIG. 4, the input circuit 200 includes a first input terminal T1, a second input terminal T2, a first capacitor C1, a second capacitor C2, a reference voltage generating circuit VG, a first resistor R1, a second resistor R2, a third resistor R3, a fourth resistor R4, a fifth resistor R5, a first switch SW1, a second switch SW2, a third switch SW3, a fourth switch SW4, a fifth switch SW5, a sixth switch SW6, a differential receiving circuit A, a first switch control circuit SC1, a second switch control circuit SC2, a first signal detecting circuit DC1, and a second signal detecting circuit DC2.

In other words, unlike in the first embodiment, the input circuit 200 further includes the third switch SW3, the fourth switch SW4, the fifth switch SW5, the sixth switch SW6, the third resistor R3, the fourth resistor R4, the fifth resistor R5, and the second switch control circuit SC2.

The third switch SW3 is connected between the first input terminal T1 and one end (third node N3) of the first capacitor C1.

The fourth switch SW4 is connected between the second input terminal T2 and one end (fourth node N4) of the second capacitor C2.

One end of the third resistor R3 is connected to the first input terminal T1.

One end of the fourth resistor R4 is connected to the second input terminal T2 and the other end of the fourth resistor R4 is connected to the other end of the third resistor R3.

One end of the fifth resistor R5 is connected to the other end of the third resistor R3.

One end of the fifth switch SW5 is connected to the other end of the fifth resistor R5 and the other end of the fifth switch SW5 is connected to one end (third node N3) of the first capacitor C1.

One end of the sixth switch SW6 is connected to the other end of the fifth resistor R5 and the other end of the sixth switch SW6 is connected to one end (fourth node N4) of the second capacitor C2.

The first signal detecting circuit DC1 receives a first input signal S1 through the first input terminal T1 and receives a second input signal S2 through the second input terminal T2. The first signal detecting circuit DC1 then outputs a detection signal based on the first input signal S1 and the second input signal S2.

If the first signal detecting circuit DC1 detects that the first input signal S1 and the second input signal S2 are fixed signals constituting DC signals in a first period, the first signal detecting circuit DC1 outputs a first detection signal Sd1.

Moreover, the first switch control circuit SC1 turns off the first switch SW1 and the second switch SW2 in response to the first detection signal Sd1.

In other words, if the first input signal S1 and the second input signal S2 are fixed signals in a first period, the first switch control circuit SC1 turns off the first switch SW1 and the second switch SW2.

Moreover, the first switch control circuit SC1 turns on the first switch SW1 and the second switch SW2 in response to a second detection signal Sd2.

In other words, the first switch control circuit SC1 turns on the first switch SW1 and the second switch SW2 in a second period during which the first input signal S1 and the second input signal S2 are AC signals.

The second switch control circuit SC2 controls the third switch SW3 and the fourth switch SW4 with a second control signal SYA and controls the fifth switch SW5 and the sixth switch SW6 with a third control signal SYB.

The second switch control circuit SC2 turns on the third switch SW3 and the fourth switch SW4 and turns off the fifth switch SW5 and the sixth switch SW6 in response to the first detection signal Sd1.

In other words, the second switch control circuit SC2 turns on the third switch SW3 and the fourth switch SW4 and turns off the fifth switch SW5 and the sixth switch SW6 in a period during which the first input signal S1 and the second input signal S2 are fixed signals immediately before the second period in the first period, and in the second period.

Moreover, the second switch control circuit SC2 turns off the third switch SW3 and the fourth switch SW4 and turns on the fifth switch SW5 and the sixth switch SW6 before the first detection signal Sd1 is outputted from the first signal detecting circuit DC1.

In other words, the second switch control circuit SC2 turns off the third switch SW3 and the fourth switch SW4 and turns on the fifth switch SW5 and the sixth switch SW6 in a period during which the first input signal S1 and the second input signal S2 are inversion signals constituting DC signals in the first period.

Other configurations of the input circuit 200 are identical to those of the first embodiment.

Figure 5:
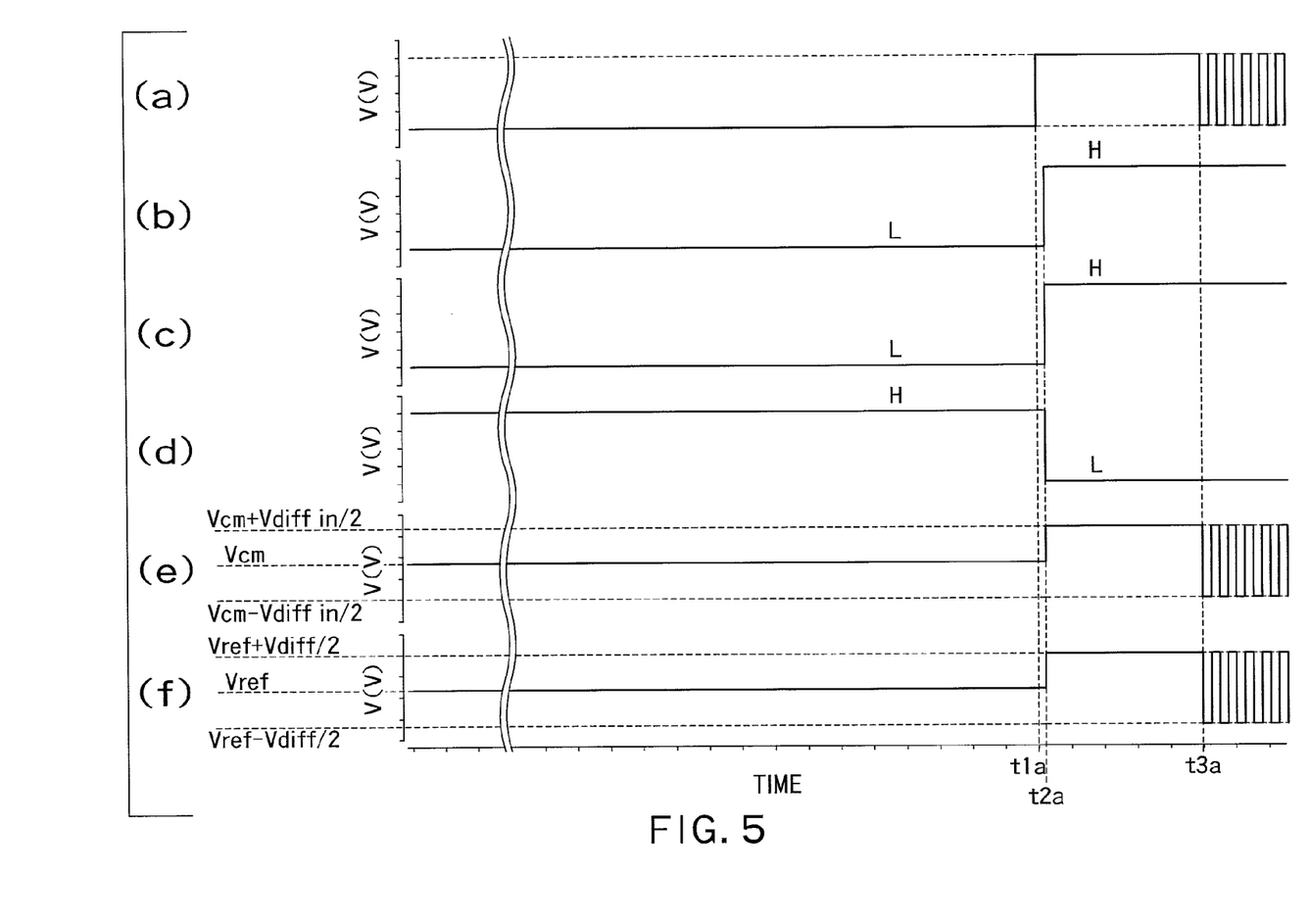
FIG. 5 shows signal waveforms inputted to the input circuit 200 of FIG. 4 and the signal waveforms of the nodes.

FIG. 5 shows signal waveforms inputted to the input circuit 200 of FIG. 4 and the signal waveforms of the nodes.

In FIG. 5, (a) indicates a differential signal inputted to the first and second input terminals T1 and T2, (b) indicates the waveform of the detection signal of the first signal detecting circuit DC1, (c) indicates the waveform of the second control signal SYA, (d) shows the third control signal SYB, (e) indicates the single-ended waveforms of the third node N3 and the fourth node N4, and (f) indicates the single-ended waveforms of the first node N1 and the second node N2.

As shown in FIG. 5, the second switch control circuit SC2 turns off the third switch SW3 and the fourth switch SW4 with the second control signal SYA ("Low" level) while the inversion signal of at least 1 us is inputted (to time t1a). Furthermore, the second switch control circuit SC2 turns on the fifth switch SW5 and the sixth switch SW6 with the third control signal SYB ("High" level).

With this configuration, the third node N3 and the fourth node N4 are connected to the junction of the third resistor R3 and the fourth resistor R4 and thus are set at the potential of a center voltage Vcm of an input differential signal.

Subsequently, the inversion signal of at least 1 us is inputted, and then a fixed signal of 100 ns is inputted at time t1a.

At time t2a, the first signal detecting circuit DC1 detects that the first input signal S1 and the second input signal S2 are fixed signals "1" in the first period, and then outputs the first detection signal Sd1 ("High" level).

In response to the first detection signal Sd1, the second switch control circuit SC2 turns on the third switch SW3 and the fourth switch SW4 with the second control signal SYA ("High" level). Furthermore, in response to the first detection signal Sd1, the second switch control circuit SC2 turns off the fifth switch SW5 and the sixth switch SW6 with the third control signal SYB ("Low" level).

At this point, the third node N3 has a potential of Vcm+Vdiff_in/2 while the fourth node N4 has a potential of Vcm−Vdiff_in/2. In response to the change of the AC signal, the first node N1 has a potential of Vref+Vdiff/2 while the second node N2 has a potential of Vref−Vdiff/2. Vdiff_in is a potential difference of the differential signal.

After that, at time t3a, a data signal is inputted as an AC signal.

The subsequent operations are identical to those of the first embodiment.

This reduces charging/discharging of the third node N3 and the fourth node N4, suppressing DC imbalance of the differential signal. Thus, deformation of an EYE waveform can be prevented.

As described above, in the input circuit 100, signals can be received while keeping the DC balance of the differential signal even at the start of communications.

Thus, the input circuit 200 can receive signals without losing a timing margin.

As described above, the input circuit according to the present embodiment can suppress a reduction in timing margin.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An input circuit comprising:
a first input terminal that receives a first input signal;
a second input terminal that receives a second input signal that is phase-reversed from the first input signal;
a first capacitor with a first end connected to the first input terminal and a second end connected to a first node;
a second capacitor with a first end connected to the second input terminal and a second end connected to a second node;
a reference voltage generating circuit that generates a reference voltage and supplies the voltage to a reference node;
a first resistor connected between the first node and the reference node;
a second resistor connected between the second node and the reference node;
a first switch connected in series with the first resistor between the first node and the reference node;
a second switch connected in series with the second resistor between the second node and the reference node;
a differential receiving circuit with a first input connected to the first node and a second input connected to the second node, the differential receiving circuit receiving differential signals inputted to the first input and the second input and outputting a single-phase output signal;
a first switch control circuit that controls the first switch and the second switch;
a first signal detecting circuit that receives the first input signal through the first input terminal and the second input signal through the second input terminal, and outputs a first detection signal based on the first input signal and the second input signal; and
a second signal detecting circuit that receives the output signal of the differential receiving circuit and outputs a second detection signal based on the output signal,
wherein the first switch control circuit turns off the first switch and the second switch in a first period during which the first input signal and the second input signal are DC signals, and
the first switch control circuit turns on the first switch and the second switch in a second period during which the first input signal and the second input signal are AC signals,
wherein the first signal detecting circuit outputs the first detection signal when the first signal detecting circuit detects that the first input signal and the second input signal are the DC signals, and
the first switch control circuit turns off the first switch and the second switch in response to the first detection signal, and wherein the second signal detecting circuit outputs the second detection signal when the second signal detecting circuit detects that the output signal is the AC signal, and
the first switch control circuit turns on the first switch and the second switch in response to the second detection signal.

2. The input circuit according to claim 1, wherein the DC signal contains at least a prespecified number of consecutive identical bits in a preset specified period, and
the AC signal contains a smaller number of consecutive identical bits than the prespecified number in the preset specified period.

3. The input circuit according to claim 2, wherein the AC signal has a one-to-one ratio of "1" and "0" in the preset specified period.

4. An input circuit comprising:
a first input terminal that receives a first input signal;
a second input terminal that receives a second input signal that is phase-reversed from the first input signal;
a first capacitor with a first end connected to the first input terminal and a second end connected to a first node;
a second capacitor with a first end connected to the second input terminal and a second end connected to a second node;
a reference voltage generating circuit that generates a reference voltage and supplies the voltage to a reference node;
a first resistor connected between the first node and the reference node;
a second resistor connected between the second node and the reference node;
a first switch connected in series with the first resistor between the first node and the reference node;
a second switch connected in series with the second resistor between the second node and the reference node;
a differential receiving circuit with a first input connected to the first node and a second input connected to the second node, the differential receiving circuit receiving differential signals inputted to the first input and the second input and outputting a single-phase output signal;
a first switch control circuit that controls the first switch and the second switch;
a third switch connected between the first input terminal and the first end of the first capacitor;
a fourth switch connected between the second input terminal and the first end of the second capacitor;
a third resistor with a first end connected to the first input terminal;
a fourth resistor with a first end connected to the second input terminal and a second end connected to a second end of the third resistor;
a fifth resistor with a first end connected to the second end of the third resistor;
a fifth switch with a first end connected to a second end of the fifth resistor and a second end connected to the first end of the first capacitor;
a sixth switch with a first end connected to the second end of the fifth resistor and a second end connected to the first end of the second capacitor; and
a second switch control circuit that controls the third switch, the fourth switch, the fifth switch, and the sixth switch, wherein the first switch control circuit turns off the first switch and the second switch in a first period during which the first input signal and the second input signal are DC signals, and the first switch control circuit turns on the first switch and the second switch in a second period during which the first input signal and the second input signal are AC signals, and wherein the second switch control circuit turns on the third switch and the fourth switch and turns off the fifth switch and the sixth switch in a period during which the first input signal and the second input signal are fixed signals constituting the DC signals immediately before the second period in the first period, and in the second period, and the second switch control circuit turns off the third switch and the fourth switch and turns on the fifth switch and the sixth switch in a period during which the first input signal and the second input signal are inversion signals constituting the DC signals in the first period.

5. The input circuit according to claim 4, further comprising a first signal detecting circuit that receives the first input signal through the first input terminal and the second input signal through the second input terminal, and outputs a first detection signal based on the first input signal and the second input signal, wherein the first signal detecting circuit outputs the first detection signal when the first signal detecting circuit detects that the first input signal and the second input signal are fixed signals immediately before the second period, and the first switch control circuit turns off the first switch and the second switch in response to the first detection signal.

6. The input circuit according to claim 5, wherein the second switch control circuit turns off the third switch and the fourth switch and turns on the fifth switch and the sixth switch before the first detection signal is outputted from the first signal detecting circuit, and the second switch control circuit turns on the third switch and the fourth switch and turns off the fifth switch and the sixth switch in response to the first detection signal.

7. The input circuit according to claim 6, wherein the DC signal contains at least a prespecified number of consecutive identical bits in a preset specified period, and the AC signal contains a smaller number of consecutive identical bits than the prespecified number in the preset specified period.

8. The input circuit according to claim 5, wherein the DC signal contains at least a prespecified number of consecutive identical bits in a preset specified period, and the AC signal contains a smaller number of consecutive identical bits than the prespecified number in the preset specified period.

9. The input circuit according to claim 4, wherein the DC signal contains at least a prespecified number of consecutive identical bits in a preset specified period, and the AC signal contains a smaller number of consecutive identical bits than the prespecified number in the preset specified period.

10. An input circuit comprising:
a first input terminal that receives a first input signal;
a second input terminal that receives a second input signal that is phase-reversed from the first input signal;
a first capacitor with a first end connected to the first input terminal and a second end connected to a first node;
a second capacitor with a first end connected to the second input terminal and a second terminal connected to a second node;
a reference voltage generating circuit that generates a reference voltage and supplies the voltage to a reference node;
a first resistor connected between the first node and the reference node;
a second resistor connected between the second node and the reference node;
a first switch connected in series with the first resistor between the first node and the reference node;
a second switch connected in series with the second resistor between the second node and the reference node;
a differential receiving circuit with a first input connected to the first node and a second input connected to the second node, the differential receiving circuit receiving differential signals inputted to the first input and the second input and outputting a single-phase output signal;
a first switch control circuit that controls the first switch and the second switch;
a third switch connected between the first input terminal and the first end of the first capacitor;
a fourth switch connected between the second input terminal and the first end of the second capacitor;
a third resistor with a first end connected to the first input terminal;
a fourth resistor with a first end connected to the second input terminal and a second end connected to a second end of the third resistor;
a fifth resistor with a first end connected to the second end of the third resistor;
a fifth switch with a first end connected to a second end of the fifth resistor and a second end connected to the first end of the first capacitor;
a sixth switch with a first end connected to the second end of the fifth resistor and a second end connected to the first end of the second capacitor; and
a second switch control circuit that controls the third switch, the fourth switch, the fifth switch, and the sixth switch.

11. The input circuit according to claim 10, further comprising a first signal detecting circuit that receives the first input signal through the first input terminal and the second input signal through the second input terminal, and outputs a detection signal based on the first input signal and the second input signal.

12. The input circuit according to claim 11, further comprising a second signal detecting circuit that receives the output signal of the differential receiving circuit and outputs a detection signal based on the output signal.

* * * * *